United States Patent
Dunn et al.

(10) Patent No.: US 8,476,913 B2
(45) Date of Patent: Jul. 2, 2013

(54) IMPROVEMENTS RELATING TO THE TESTING OF AN EARTH CONNECTION

(75) Inventors: John Dunn, Nottingham (GB); Ian Edge, Long Eaton (GB)

(73) Assignee: Newson Gale Limited, Nottingham (GB)

( * ) Notice: Subject to any disclaimer, the term of this patent is extended or adjusted under 35 U.S.C. 154(b) by 676 days.

(21) Appl. No.: 12/600,206

(22) PCT Filed: May 19, 2008

(86) PCT No.: PCT/GB2008/050359
§ 371 (c)(1),
(2), (4) Date: Nov. 13, 2009

(87) PCT Pub. No.: WO2008/142447
PCT Pub. Date: Nov. 27, 2008

(65) Prior Publication Data
US 2010/0301881 A1    Dec. 2, 2010

(30) Foreign Application Priority Data

May 17, 2007   (GB) .................................. 0709475.8

(51) Int. Cl.
*G01R 31/14*    (2006.01)
*H02H 3/00*    (2006.01)

(52) U.S. Cl.
USPC .............................. 324/707; 324/509; 361/42

(58) Field of Classification Search
USPC ............... 324/509–511; 361/42–50, 271–330
See application file for complete search history.

(56) References Cited

U.S. PATENT DOCUMENTS

| 3,343,154 | A | | 9/1967 | Seesselberg |
| 3,641,473 | A | | 2/1972 | Attaway |
| 4,558,309 | A | * | 12/1985 | Antonevich .................. 340/649 |
| 4,649,374 | A | | 3/1987 | Hoigaard |

(Continued)

FOREIGN PATENT DOCUMENTS

| EP | 0407186 A2 | 1/1991 |
| EP | 0534702 A1 | 3/1993 |

(Continued)

OTHER PUBLICATIONS

International Search Report for International Patent Application No. PCT/GB2008/050359 (May 19, 2008).

(Continued)

*Primary Examiner* — Melissa Koval
*Assistant Examiner* — Farhana Hoque
(74) *Attorney, Agent, or Firm* — LeClairRyan, a Professional Corporation

(57) ABSTRACT

A device (10) is disclosed that is suitable for testing an earth connection (30) that is isolated from a mains electricity supply. The device (10) comprises means (14, 40) for electrically connecting the device (10) to the earth connection (30), and means (16, 32) for electrically connecting the device (10) to an electrically conductive item (20) having a capacitance relative to an adjacent surface of the earth that is within a pre-determined range of capacitances. Furthermore, the device (10) includes means for generating an AC signal and delivering the AC signal to the electrically conductive item, and means for determining whether the resistance between the earth connection (30) and earth reference potential is less than a maximum earth resistance value. This determination is achieved by comparing the frequency of the generated AC signal with a pre-determined range of frequencies.

27 Claims, 12 Drawing Sheets

U.S. PATENT DOCUMENTS

| | | | |
|---|---|---|---|
| 4,656,327 A | | 4/1987 | Wilcox |
| 4,742,295 A | | 5/1988 | Nahman et al. |
| 4,901,195 A | | 2/1990 | Stemporzewski, Jr. |
| 5,034,726 A | | 7/1991 | Blondin |
| 5,113,303 A | | 5/1992 | Herres |
| 5,159,523 A | | 10/1992 | Claassen et al. |
| 5,361,183 A | * | 11/1994 | Wiese .............................. 361/42 |
| 5,365,179 A | | 11/1994 | Rogers |
| 5,686,897 A | | 11/1997 | Loh |
| 5,772,468 A | | 6/1998 | Kowalski et al. |
| 5,835,327 A | | 11/1998 | Siew et al. |
| 5,909,181 A | | 6/1999 | Golzmane |
| 6,924,740 B2 | * | 8/2005 | Edge .............................. 340/549 |
| 2007/0176604 A1 | * | 8/2007 | Morimoto .................... 324/525 |

FOREIGN PATENT DOCUMENTS

| | | |
|---|---|---|
| EP | 100864 A1 | 6/2000 |
| EP | 1305645 B1 | 7/2005 |
| GB | 2191591 A | 12/1987 |
| GB | 2342455 A | 4/2000 |
| JP | 11248767 A | 9/1999 |
| JP | 2000214197 A | 8/2000 |

OTHER PUBLICATIONS

UK Search Report for Application No. GB0709475.8 (Apr. 29, 2008).

"Earth-Rite Plus Dual mode (ATEX Specification) Static Ground Indicator and Interlock System for Road Tankers" (English), Newson Gale Ltd, Nottingham, United Kingdom (Sep. 26, 2006).

"Earth-Rite Plus with EExd IIB enclosure and 2-pole cable reel", Installation and Operating Instructions, Newson Gale Ltd, Nottingham, United Kingdom(Feb. 24, 2006).

"Earth-Rite Plus with EExd IIB enclosure and spiral cable", Installation and Operating Instructions, Newson Gale Ltd, Nottingham, United Kingdom (Feb. 24, 2006).

"Earth-Rite Plus with EExd IIC enclosure and spiral cable", Installation and Operating Instructions, Newson Gale Ltd, Nottingham, United Kingdom, (Feb. 24, 2006).

"Earth-Rite Plus Dual mode" (USA), Newson Gale Ltd, Nottingham, United Kingdom, (Jul. 11, 2006).

"Earth-Rite Plus Static Ground Indicator and Interlock System" (UK Version), Newson Gale Ltd, Nottingham, United Kingdom (Jul. 11, 2006).

* cited by examiner

IMPROVEMENTS RELATING TO THE TESTING OF AN EARTH CONNECTION

This application is a national stage application under 35 U.S.C. §371 from PCT Application No. PCT/GB2008/050359, filed May 19, 2008, which claims the priority benefit of Great Britain Application No. 0709475.8, filed May 17, 2007.

This invention relates to testing a connection to earth reference potential, and in particular to a device for testing whether an earth connection that is isolated from a mains electricity supply is effectively connected to earth reference potential by a resistance that is less than a maximum earth resistance value. The device according to the invention is of particular utility in relation to the dissipation of electrostatic charge from an electrically conductive item in environments in which build-up of static electricity is undesirable.

In any organisation that stores, handles or processes flammable liquids, powders, or gases, there is a risk of static-caused ignitions within hazardous atmospheres. Apart from business interruption costs resulting from lost product, these incidents may cause serious injury to people and damage to equipment, buildings and the environment, as well as the possibility of legal action and the attendant bad publicity for the organisation concerned.

In order to combat the build up and unwanted discharge of static electricity in hazardous atmospheres, electrically conductive items (both fixed and mobile) that are liable to accumulate static electricity are generally connected to earth reference potential by a suitable protective system, thus dissipating any charge before a dangerous level can be reached. In particular, conventional protective systems include means for effectively connecting any electrically conductive items that are liable to accumulate static electricity, such as metal equipment and storage containers, with earth reference potential in order to safely dissipate static electricity from those items.

A protective system that is commonly used includes an earthing clamp that is fastened to the item concerned, the earthing clamp being connected to one end of a low-resistance cable, the other end of which is connected to an earth connection. Devices have also been developed that monitor the connection between the earthing clamp and the item concerned, in order to alert the user to an ineffective connection that could enable dangerously high levels of static electricity to accumulate on the item. For instance, the monitoring device described by EP 1305645 reliably monitors the resistance between the jaws of an earthing clamp and alerts a user of the clamp should that resistance be above an acceptable level.

Conventional protective systems generally include an earth connection that connects the system to a mains electricity supplied earth, which is therefore assumed to be a high integrity connection. However, it is sometimes necessary for an electrical conductor, such as the body of a vehicle, eg a road tanker, to be connected to an earth connection that is not mains electricity supplied. In particular, the electrical conductor may be connected to a so-called earth rod, which is a metal rod that is driven into the earth, or existing metalwork connected to the earth, such as I-beams, pipework, storage tanks, or other structural metalwork. In this case, there is a need to verify the integrity of the earth connection, and in particular to test whether the electrical conductor is reliably connected to earth reference potential by a resistance equal to or less than a predetermined value.

Earth resistance testers are currently available that measure the resistance between an earth connection and the earth. A principal drawback of these earth resistance testers is that the driver of a vehicle needs to be trained to calibrate the tester, and interpret and record the readings, or else a qualified electrician needs to be present to verify the readings. A second drawback with this method is that there is generally no fail-safe mechanism in the event that no resistance readings are taken, the readings are falsified, or the readings are incorrectly interpreted by an operator.

Two commonly used types of earth resistance testers are the fall-of-potential tester and the clamp-on tester. The fall-of-potential tester utilises two small earth probes, which are driven into the earth so as to make good contact with the earth. One of these probes, commonly referred to as the current probe, is used to inject a test current into the earth and is placed some distance (typically 30 m) away from the earth connection being tested. The second probe, known as the potential probe, is inserted at intervals within the current path and measures the voltage drop produced by the test current flowing through the resistance of the earth. Based on empirical data, the voltage/current value measured at 62% of the distance from the earthing medium to the current probe is taken as the system earth resistance. However, this testing method is complex, typically requiring a series of readings in order to obtain a sufficiently accurate measurement of the resistance. It therefore requires a person with a high level of training and is time consuming. In addition, the earth connection being tested must be disconnected from the item being earthed. Another drawback of this method of testing is that the recommended distance between the earth connection and the current probe can be excessive, which may require the current probe to be located on neighboring property or roads, which may be an impractical or perhaps impossible task.

The clamp-on tester is simpler and less time-consuming that the fall-of-potential tester. It injects a current pulse into the earth connection and calculates the value of the system earth resistance from the current pulse amplitude. Clamp-on earth resistance testers, although reasonably convenient, typically provide less accurate readings than fall-of-potential testers. Furthermore, clamp-on testers are typically only adapted for use with earth rods, and cannot generally be used to test other earth connections, such as those provided by existing metalwork connected to the earth, for example I-beams, pipework, storage tanks, or other structural metalwork.

There has now been devised an improved device for testing an earth connection, and an improved device for dissipating electrostatic charge from an electrically conductive item, which overcome or substantially mitigate the above-mentioned and/or other disadvantages associated with the prior art.

According to a first aspect of the invention, there is provided a device for testing an earth connection that is isolated from a mains electricity supply, the device comprising means for electrically connecting the device to the earth connection, means for electrically connecting the device to an electrically conductive item having a capacitance relative to an adjacent surface of the earth that is within a pre-determined range of capacitances, means for generating an AC signal and delivering the AC signal to the electrically conductive item, and means for determining whether the resistance between the earth connection and earth reference potential is less than a maximum earth resistance value by comparing the frequency of the generated AC signal with a pre-determined range of frequencies.

According to a further aspect of the invention, there is provided a method of testing an earth connection that is isolated from a mains electricity supply, the method comprising the steps of:

(a) connecting the device described above to the earth connection, and connecting the device to an electrically conductive item having a capacitance relative to an adjacent surface of the earth that is within a pre-determined range of capacitances, (b) generating an AC signal and delivering the AC signal to the electrically conductive item, and (c) determining whether the resistance between the earth connection and earth reference potential is less than a maximum earth resistance value by comparing the frequency of the generated AC signal with a pre-determined range of frequencies.

The pre-determined range of frequencies preferably corresponds to impedances generated by at least the pre-determined range of capacitances, and resistances between the earth connection and earth reference potential that are less than the maximum earth resistance value.

The device and associated method according to these aspects of the invention are advantageous principally because the device is able to readily determine whether the resistance between the earth connection and earth reference potential is less than a maximum earth resistance value, and hence whether the earth connection is sufficiently effective for a particular purpose, such as the dissipation of electrostatic charge. The device does not require any additional apparatus, or additional earth connections. The device is also advantageous because it may be adapted to connect the electrically conductive item to the earth connection, once the earth connection has been verified, without any need to alter the connections between the device and the earth connection and the electrically conductive item.

The device and associated method described above are particularly advantageous for testing an earth connection that is to be used for the dissipation of electrostatic charge from the electrically conductive item. In this case, the device according to the invention preferably includes means for connecting the electrically conductive item to the earth connection if the frequency of the generated AC signal falls within the pre-determined range of frequencies, and hence the resistance between the earth connection and earth reference potential is less than the maximum earth resistance value.

According to a further aspect of the invention, there is provided a device for dissipating electrostatic charge from an electrically conductive item having a capacitance relative to an adjacent surface of the earth that is within a pre-determined range of capacitances, the device comprising means for electrically connecting the device to an earth connection that is isolated from a mains electricity supply, means for electrically connecting the device to the electrically conductive item, means for generating an AC signal and delivering the AC signal to the electrically conductive item, means for comparing the frequency of the generated AC signal with a pre-determined range of frequencies to determine whether the resistance between the earth connection and earth reference potential is less than a maximum earth resistance value, and means for connecting the electrically conductive item to the earth connection if the frequency of the generated AC signal falls within the pre-determined range of frequencies.

According to a further aspect of the invention, there is provided a method of dissipating electrostatic charge from an electrically conductive item having a capacitance relative to an adjacent surface of the earth that is within a pre-determined range of capacitances, the method comprising the steps of:

(a) connecting the device described above with an earth connection that is isolated from a mains electricity supply, and connecting the device to the electrically conductive item, (b) generating an AC signal and delivering the AC signal to the electrically conductive item, (c) comparing the frequency of the generated AC signal with a pre-determined range of frequencies to determine whether the resistance between the earth connection and earth reference potential is less than a maximum earth resistance value, and (d) connecting the electrically conductive item to the earth connection if the frequency of the generated AC signal falls within a pre-determined range of frequencies.

The pre-determined range of frequencies preferably corresponds to impedances generated by at least the pre-determined range of capacitances, and resistances between the earth connection and earth reference potential that are less than the maximum earth resistance value.

The device and method according to these aspects of the invention are advantageous principally because the device is able to test the effectiveness of an earth connection that is isolated from a mains electricity supply and then dissipate static electricity through that earth connection. The device may therefore be adapted to be mobile and/or may be adapted to engage an earth connection that is sited remotely from any mains electricity supply.

The present invention is particularly advantageous where the electrically conductive item is a vehicle, such as a truck or road tanker, that transports flammable material, such as liquids, powders or gases. In this case, the device according to the invention is preferably mounted upon the vehicle. Hence, according to a further aspect of the invention, there is provided a vehicle having a device as described above mounted thereon.

The device is specifically adapted for use with earth connections that are not mains electricity supplied, and hence have not been verified as being an effective earth connection. For instance, the earth connection will typically be a so-called "earth rod", which is a metal rod that is driven into the earth. Alternatively, the earth connection may be existing structural metalwork in contact with the earth, such as I-beams, pipework or storage tanks. In any case, however, the earth connection will include an electrical conductor to which the device is able to connect, and which is also in electrical contact with the earth, so as to create an electrical path from the device to earth reference potential.

The means for electrically connecting the device to the earth connection and the means for electrically connecting the device to the electrically conductive item are preferably electrical connectors that include at least one electrical contact. Most preferably, each of these electrical connectors includes at least two separate electrical contacts. The electrical connectors may form fixed electrical connections with the earth connection and/or the electrically conductive item, and hence may be standard electrical terminals. However, since the device will typically be adapted for use with different electrically conductive items and/or different earth connections, at least one of the electrical connectors is preferably removably connectable to the earth connection or the electrically conductive item.

Where the device is adapted to be mounted on the electrically conductive item, such as a vehicle, the electrical connector for connecting the device to the earth connection is preferably removably connectable to the earth connection, and is preferably an earthing clamp. The means for electrically connecting the device to the electrically conductive item is preferably a fixed electrical connection, such as a standard electrical terminal. The device preferably has two separate connections to the electrically conductive item. Where the electrically conductive item is a vehicle, the device is preferably connected to a so-called "earthing point" of the vehicle, which is a part of the vehicle that is electrically connected to the majority, if not all, of the body of the vehicle. The earthing point of a vehicle is typically connected directly to the chassis of the vehicle. Although the connection between the device and the vehicle is preferably fixed, where the device is intended to be transferred regularly between vehicles, it may be appropriate for the device to include a readily releasable connection with the vehicle, such as a clamp. In this case, the clamp may have a similar form to the earthing clamp for connecting the device to the earth connection.

Alternatively, the device may be adapted to be mounted on the earth connection itself, or on a mounting adjacent to the earth connection. In particular, the device may be adapted to be mounted on, or adjacent to, metalwork that is in contact with the earth, where the metalwork forms the earth connection. In this embodiment, the means for electrically connecting the device to the electrically conductive item, such as a vehicle, is preferably an earthing clamp. Furthermore, the means for connecting the device to the earth connection is preferably a fixed electrical connection, such as a standard electrical terminal, and the device preferably has two separate electrical contacts that connect to the earth connection. Although the connection between the device and the earth connection in this embodiment is preferably fixed, where the device is intended to be transferred regularly between different earth connections, or different parts of the same earth connection, it may be appropriate for the device to include a readily releasable connection with the earth connection, such as a clamp. In this case, the clamp may have a similar form to the earthing clamp for connecting the device to the electrically conductive item.

The device preferably comprises an electronic circuit that includes the means for generating an AC signal, and the means for comparing the frequency of the generated AC signal with a pre-determined range of frequencies. The circuit is preferably mounted on a circuit board, which is housed within a suitable protective housing. The electrical connectors for connection with the earth connection and the electrically conductive item are preferably situated externally of the protective housing. The circuit is preferably connected to the electrical connectors, and the electrical connectors preferably each comprise a cable that extends from the circuit within the protective housing and through a wall of the protective housing.

The earthing clamp may comprise a pair of spring-loaded jaws which are engaged with the earth connection or the electrically conductive item. Application of the earthing clamp by means of spring-loaded jaws has the advantage that the earthing clamp may be positioned easily using just one hand, even where the user is wearing protective gloves or other clothing. Other forms of application may, however, be used where appropriate, eg clamping by threaded bolts or the like.

The maximum earth resistance value is preferably selected to be appropriate for the particular application for which the earth connection is to be used. For instance, where the earth connection is to be used for the dissipation of electrostatic charge, the maximum earth resistance is preferably less than 3000Ω, more preferably less than 2000Ω, and most preferably less than 1200Ω. Furthermore, where the earth connection is to be used for the dissipation of electrostatic charge, the maximum earth resistance is preferably at least 100Ω, more preferably at least 200Ω, and most preferably at least 400Ω.

These ranges refer to preferred values of the maximum earth resistance, and hence the upper limit of a range of permissible earth resistances. The lower limit of the permissible earth resistances will generally be zero resistance.

The frequency of the generated AC signal will depend principally upon the impedances generated by the capacitor defined by the electrically conductive item and the adjacent surface of the earth, and the resistance between the earth connection and earth reference potential. However, additional variables will have some effect on the frequency of the generated AC signal, such as the resistance of the path to earth through the tyres of the vehicle, and the pre-determined range of frequencies is preferably calculated to take into account those additional variables.

The pre-determined range of frequencies is determined on the basis that the electrically conductive item defines a capacitor with an adjacent surface of the earth that has a capacitance within the pre-determined range of capacitances. Where the device is adapted for use with vehicles, the device is preferably adapted for use with a standard range of vehicles, such as typical road tankers. The range of capacitances achieved by a standard range of vehicles is preferably determined by appropriate experiments. For example, it has been found by experiment that typical road tankers define capacitors with an adjacent surface of the earth that have a capacitance of between 5.0 nF and 3.0 µF.

In order to determine the range of frequencies of the generated AC signal that correspond to impedances generated by the pre-determined range of capacitances and resistances between the earth connection and earth reference potential that are less than the maximum earth resistance value, the device may be tested with vehicles of known capacitances and earth connections of known resistances.

The pre-determined range of capacitances must be sufficiently high that other capacitances, such as that provided by the user, do not cause the frequency of the AC signal to fall within the pre-determined range of frequencies. Hence, the device may be provided with means for increasing the capacitance encountered by the AC signal, so that a particular device may be used with electrically conductive items that define a capacitor having a lower capacitance than that achieved by items with which the device has been calibrated. Such means preferably comprises an additional electrically conductive item that is separated from the earth by an insulating material, the additional electrically conductive item being connected to the circuit, eg by a cable. In presently preferred embodiments, the additional electrically conductive item comprises a metal plate and an electrically insulating barrier, such that the additional electrically conductive item is adapted to rest upon the surface of the earth, but be insulated therefrom. Most preferably, the barrier comprises an electrically insulating paint, which is preferably static-dissipative in nature.

Alternatively, the device may include one or more capacitors adapted to increase the capacitance encountered by the AC signal, so that a particular device may be used with electrically conductive items that define a capacitor having a lower capacitance than that achieved by items with which the device has been calibrated. Most preferably, these one or more capacitors are adapted to be selectively connected to the circuit, for example by a suitable switching unit. These one or more capacitors are therefore suitable for being connected to the circuit in the event that the capacitance of the electrically conductive item, eg the vehicle, relative to the adjacent surface of the earth is low. Furthermore, these additional capacitors may be less affected by series resistance within the earth, and therefore make the circuit more reliable where high electrical resistance soil conditions exist.

The device may include means for automatically connecting the electrically conductive item to the earth connection when the device has established that the frequency of the generated AC signal falls within the pre-determined range of frequencies, and hence the resistance between the earth connection and earth reference potential is less than the maximum earth resistance value. In particular, the means for comparing the frequency of the generated AC signal with a pre-determined range of frequencies may be adapted to actuate an electronic switch, such as a relay, that causes the circuit to define an electrical path between the earthing clamp and the connection with the electrically conductive item. The circuit may then switch into a permissive state, in which an indicator indicates to the user that the electrically conductive item is effectively connected to earth reference potential through the earth connection and/or a control circuit is actuated that enables a particular action, such as transferring a flammable material to or from a vehicle, to take place.

However, in presently preferred embodiments, the circuit also includes means for determining whether the resistance between the electrically conductive item and the earth connection is within an acceptable range. In particular, the circuit preferably includes means for determining whether the resistance between the two electrical contacts of an electrical connector that is removably connectable to either the earth connection or the electrically conductive item is less than a predetermined contact resistance value, and the circuit is preferably adapted to switch to a permissive state only in the event that this condition is also satisfied. Such means preferably comprises a DC current loop that includes a path between the two electrical contacts of the electrical connector, most preferably through a conductive part of the associated electrically conductive item or earth connection, and has a voltage output that is dependent upon the resistance between the contacts of electrical connectors, and a comparator which determines whether said voltage output is greater or less than a pre-determined reference voltage, and hence whether the resistance between the contacts of the electrical connector is less than the predetermined contact resistance value. Most preferably, the DC current loop also passes between the electrical contacts of the remaining electrical connector, whether this electrical connector is removably connectable, or fixed, to the earth connection or the electrically conductive item, so that the device will only switch to the permissive state if the resistance between the contacts of both electrical connectors together equal a resistance that is less than the predetermined contact resistance value.

The two electrical contacts of the electrical connector that connects the device to the earth connection, and/or the two electrical contacts of the electrical connector that connects the device to the electrically conductive item, are preferably connected to the circuit of the device by dual-core cables, which are preferably of low resistance.

In presently preferred embodiments, once the device has been switched to a permissive state, a resistance monitoring mode is triggered. In the resistance monitoring mode, the circuit preferably monitors, either continually or intermittently, whether the resistance between the two electrical contacts of a removably connectable electrical connector is less than a predetermined value, which is preferably the predetermined contact resistance value discussed above. In particular, the circuit preferably includes a DC current loop that includes a path between the electrical contacts of the removably connectable electrical connector and has a voltage output that is dependent upon the resistance between the electrical contacts, and a comparator which determines whether said voltage output is greater or less than a pre-determined reference voltage, and hence whether the resistance between the electrical contacts is less than the predetermined contact resistance value. If this condition is not satisfied at any point in time, the circuit preferably switches to a non-permissive state. Most preferably, the DC current loop also passes between the two electrical contacts of the other electrical connector, whether this electrical connector is removably connectable, or fixed, to the earth connection or the electrically conductive item, so that the resistance monitoring mode causes the device to switch to a non-permissive state if the resistance between the electrical contacts of both electrical connectors together equal a resistance that is greater than the predetermined contact resistance value.

Where the device is adapted for the dissipation of electrostatic charge, the predetermined contact resistance value is preferably about 10 Ohms, as recommended in British Standard 5958—Control of Undesirable Static Electricity. Furthermore, the device is preferably adapted to be certified as "intrinsically safe". This means that the device is unable to release sufficient energy, by either thermal or electrical means, into the potentially explosive atmosphere to cause ignition of flammable material (gas or dust/particulates). This is preferably achieved by supplying the components external to the protective housing, such as the electrical connectors, and any associated cables, from a single intrinsically safe supply within the circuit.

Where the device is adapted to be mounted on a vehicle, the device is preferably adapted to be connected to a DC power supply, such as a conventional 12V or 24V vehicle battery. In this case, the circuit may be adapted to be powered directly by that DC signal, and hence include a voltage regulator for supplying a suitable voltage to the remainder of the circuit. Most preferably, the device is provided with a switched-mode power supply comprising a DC-DC converter.

The device may alternatively be adapted to be connected to an AC supply, such as a mains electricity supply. In this case, the circuit preferably includes a transformer for stepping-down the voltage, and a voltage regulator for supplying a suitable voltage to the remainder of the circuit. In this case, the parts of the circuit that include components that are external to the device housing are preferably galvanically isolated from the earth connection of the mains electricity supply. This galvanic isolation is preferably achieved by one or more isolating components, such as transformers and opto-isolators.

Where the device is adapted to be mounted on a vehicle, the device preferably comprises a power supply unit for connecting the device to a battery of the vehicle, and a monitoring unit including a measurement circuit and connections to the vehicle and the earth connection. In particular, the power supply unit and the monitoring unit are preferably housed separately, such that the power supply unit may be located in the proximity of the battery of the vehicle, typically at the front of the vehicle, and the monitoring unit may be located at a different part of the vehicle, for example at the rear of the vehicle. The power supply unit and the monitoring unit are preferably connected by a cable that connects the voltage outputs of the power supply unit to the monitoring unit.

Since the earth connection to which the vehicle is to be connected will typically be at the rear of the vehicle, this arrangement of a separate power supply unit and monitoring unit removes the need for the cable to the earthing clamp to be of sufficient length to run along the entire length of the vehicle, from the front to the rear of the vehicle, in order to connect to the earth connection. This arrangement therefore removes the need for the length of the cable to be adapted specifically for each vehicle, and also removes any requirement for calibrating the circuit of each device to take account of the capacitance effects of the particular length of cable that is being utilised. In particular, devices may be supplied with a standard, relatively short, length of cable, the capacitance effects of which have already been taken into account in the calibration of the device.

The circuit preferably includes outputs for indicating to the user the status of the earth connection, and/or outputs for controlling external operations, such as transferring flammable material to, and from, the electrically conductive item, eg vehicle. In presently preferred embodiments, the device has a first non-permissive state in which the capacitance of the electrically conductive item is outside, ie generally lower than, the pre-determined range of capacitances. This condition ensures that the device does not switch to a permissive state when connected to an item for which the device has not been calibrated, for example an item that is not a vehicle. The device preferably also has a second non-permissive state in which the resistance between the earth connection and earth reference potential is greater than the maximum earth resistance value. This condition ensures that the device is connected to a sufficiently effective earth connection. The device preferably also has a third non-permissive state in which the resistance between the electrical contacts in the DC current loop is greater than the predetermined contact resistance value. This condition ensures that the connection between the electrical connector(s) and the earth connection and/or the electrically conductive item is sufficiently effective. Although the device could have a permissive state in which only the first and second conditions set out above are satisfied, the device preferably has a permissive state in which the first, second and third conditions are satisfied.

The device preferably includes means for indicating the non-permissive or permissive state of the device. Such means may comprise indicator lamps, and most preferably comprises one or more indicator LEDs. The device may also, or instead, actuate one or more control circuits that control external systems, such as systems for loading and unloading of flammable material from the electrically conductive item, such as vehicle pumping systems. The device may also be adapted to output data to a computer, or a programmable logic circuit, which may be used to collect and store information from the device.

In presently preferred embodiments, the tips of the jaws of the earthing clamp carry at least two separate electrical contacts by which the electrical connection is made between the earthing clamp and the earth connection or electrically conductive item to which it is applied. Most preferably, the earthing clamp is provided with three contacts, one of these contacts being provided on one of the earthing clamp jaws and the other two contacts being provided on the other jaw. When the earthing clamp is closed, the two contacts on one jaw preferably lie to either side of the single contact on the other jaw, the three contacts preferably lying substantially in a common plane. Most preferably, two of these three contacts make electrical contact with the earth connection and are connected to the circuit, the third contact being of insulating material.

This specification uses the terms "earth", "earthed" and "earthing", which are IEC standard terminology. In North America, the commonly-used terms are "ground", "grounded" and "grounding".

Preferred embodiments of the invention will now be described in greater detail, by way of illustration only, with reference to the accompanying drawings, in which FIG. 1 is a schematic drawing of a first embodiment of a device according to the invention, mounted on a road tanker and connected to an earth connection;

Figure 1:
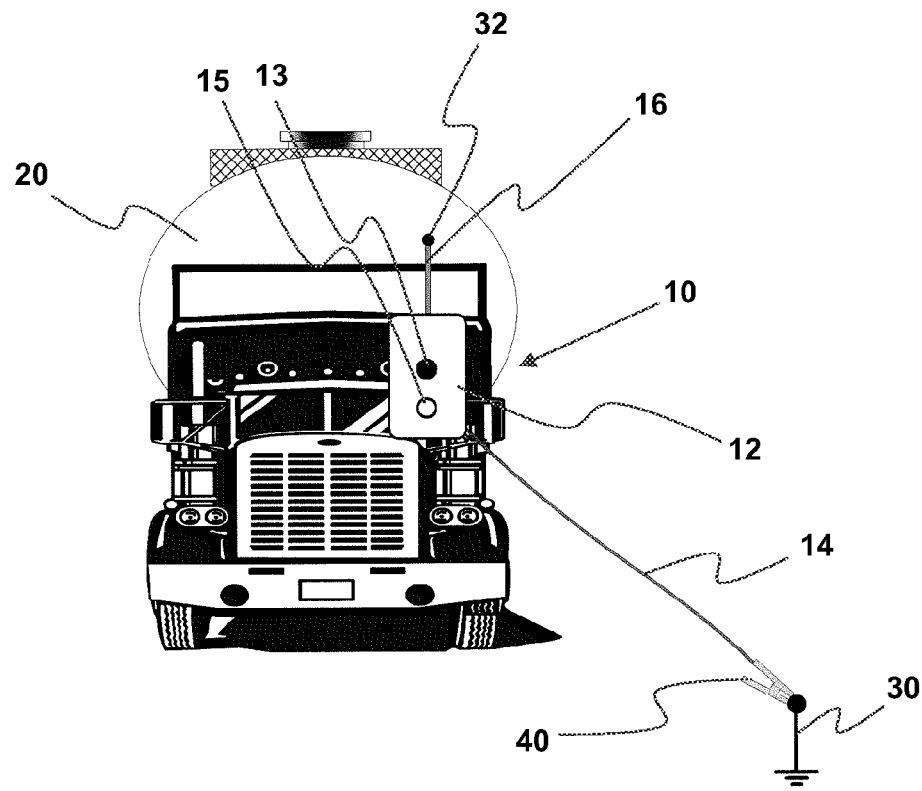

FIG. 1 is a schematic drawing of a first embodiment of a device according to the invention, which is generally designated 10, the device 10 being mounted on a road tanker 20 and connected to an earth connection 30. The device 10 comprises a housing 12, a dual-core cable 14 and an associated earthing clamp 40 for connecting the device 10 to the earth connection 30, and a dual-core cable 16 that extends from the device 10 to an electrical terminal 32 at an earthing point of the road tanker 20. The earthing point of the road tanker 20 will generally be a part of the road tanker's chassis.

The earth connection 30 provides a connection to the earth that enables the dissipation of static electricity from the road tanker 20 to earth reference potential, via the earthing point of the road tanker 20, the circuit of the device 10, and the earthing clamp 40. The device 10 is specifically adapted for use with earth connections that are not mains electricity supplied. For instance, the earth connection 30 will typically be a so-called "earth rod", which is metal rod that is driven into the earth. Alternatively, the earth connection 30 may be existing structural metalwork in contact with the earth, such as I-beams, pipework or storage tanks. In any case, however, the earth connection 30 will include an electrical conductor with which the earthing clamp 40 is able to engage, and which is also in electrical contact with the earth, so as to create an electrical path from the circuit of the device 10 to earth reference potential.

Figure 3:
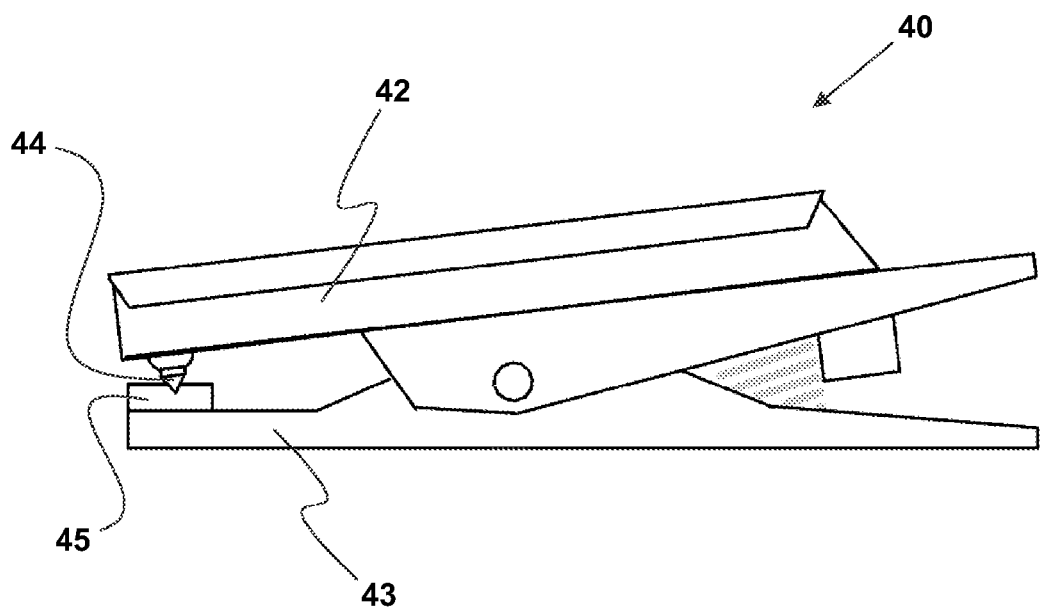
FIG. 3 is a side view of a clamp that forms part of the devices of FIGS. 1 and 2.
Figure 4:
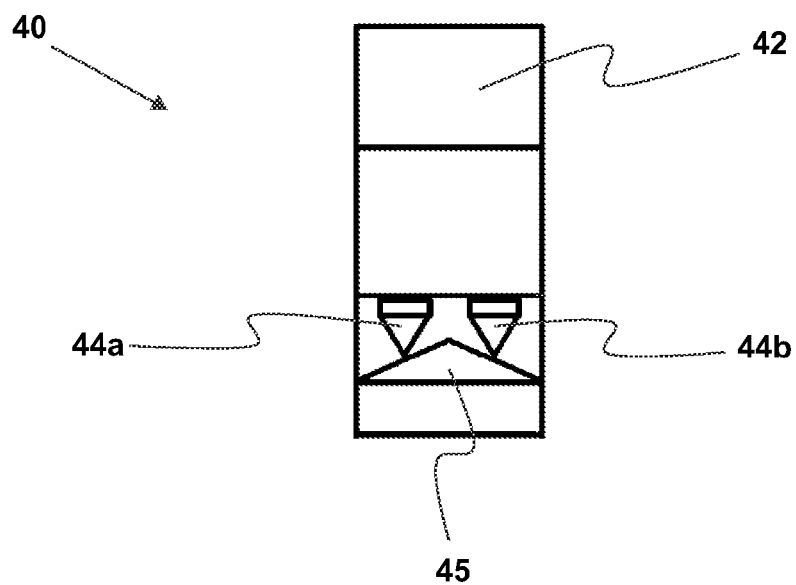
FIG. 4 is a front view of the clamp of FIG. 3.

The earthing clamp 40 is shown in more detail in FIG. 3. The earthing clamp 40 comprises a pair of spring-loaded jaws 42,43, the tips of which are fitted with juxtaposed mechanical point contacts 44,45. The two-core cable 14 that is connected to the earthing clamp 40 may be in the form of flexible spiral cable or may be wound on a spring-loaded self-retracting cable drum. The arrangement of the point contacts 44,45 is shown more clearly in FIG. 4. As can be seen, there are a pair of contacts 44a,44b side-by-side on the underside of the upper jaw 42, juxtaposed with a single, central contact 45 on the lower jaw 43. The lower contact 45 is of electrically insulating material and is of elongated form, while the upper contacts 44a,44b are electrically conductive and conical in shape. The three-point mechanical contact between the upper and lower contacts 44a,44b,45 ensures stable and reliable application of the earthing clamp 40, even when the electrical conductor of the earth connection 30, to which the earthing clamp 40 is applied, is of irregular shape.

The device 10 includes a fail indicator lamp 30, which is red in colour, and a pass indicator lamp 15, which is green in colour. The indicator lamps 13,15 are located within the device housing 12, and are arranged so as to illuminate lenses formed in the wall of the housing 12.

Figure 7:
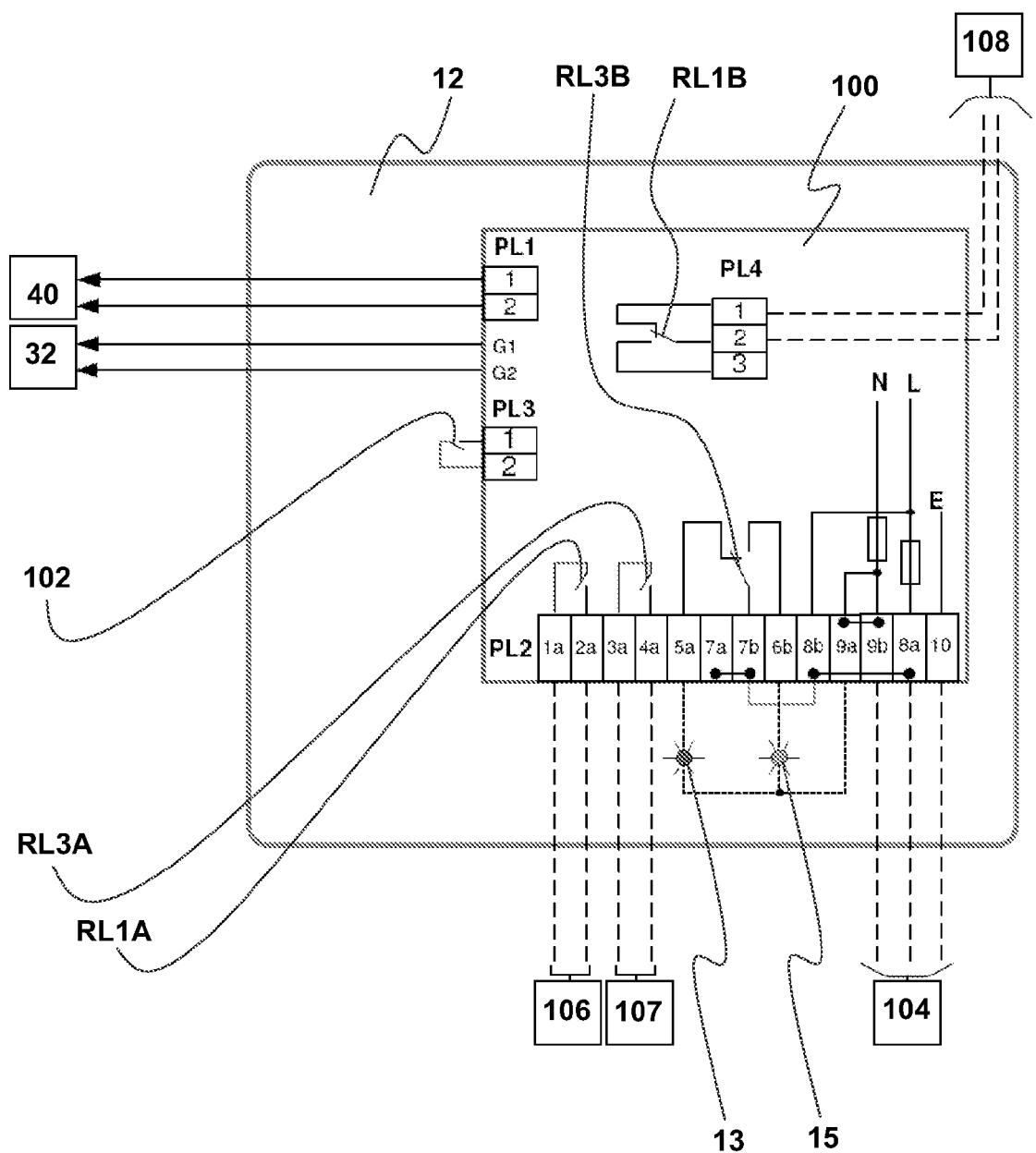
FIG. 7 is a schematic drawing of a housing and a circuit board that form part of both the first and second embodiments of the device according to the invention.

FIG. 7 is a schematic drawing of the device housing 12 and a circuit board 100 that is mounted within the housing 12. The circuit board 100 accommodates the circuit of the device 10, and includes four main connection sockets, PL1, PL2, PL3 and PL4, and also two earth connections G1 and G2.

The earth connections G1/G2 are connected to the electrical terminal 32 at the earthing point of the road tanker 20 by its associated dual-core cable 16, and the two pins of connection socket PL1 are connected to the earthing clamp 40 by its associated dual-core cable 14. Connection socket PL3 is connected to a remote switch 102 that enables the user to by-pass the testing of the earth connection, as discussed in more detail below.

Connection socket PL2 is connected to an AC power supply 104 of 240V or 110V, at 50 Hz, through pins 8a, 9b and 10, with the neutral connection (N) at pin 9b, the live connection (L) at pin 8a and the earth connection (E), if any, at pin 10. Since the device 10 is adapted to be mounted on a road tanker 20, the device 10 also includes a power conversion module (not shown in the Figures) that converts the 12V or 24V DC signal supplied by the road tanker's battery into the AC power supply 104 that the circuit board 100 of the device 10 is adapted to receive through PL2, as discussed above.

Pins 5a, 6b and 9a of connection socket PL2 are connected to the pass indicator lamp 15 and the fail indicator lamp 13, and pins 1a, 2a, 3a and 4a are connected to two separate control circuits 106,107 that each controls a system for loading and unloading of flammable material, such as pumping systems of the road tanker 20. Connection between the AC power supply 104 and the indicator lamps 13,15 is controlled by relay contact RL3B, and connection between the AC power supply 104 and the control circuits 106,107 is controlled by relay contacts RL1A and RL3A, as discussed in more detail below.

Connection socket PL4 is adapted to be connected to a computer 108, or a programmable logic circuit, which may be used to collect and store information from the device 10.

FIGS. 8 to 11 are circuit diagrams that together show the circuit of the device 10. The circuit has been divided between four Figures for clarity. The divided parts of the circuit are connected along connecting paths 200, 202, 204 and 206, which are indicated by broken lines and arrows in FIGS. 8 to 11.

Figure 8:
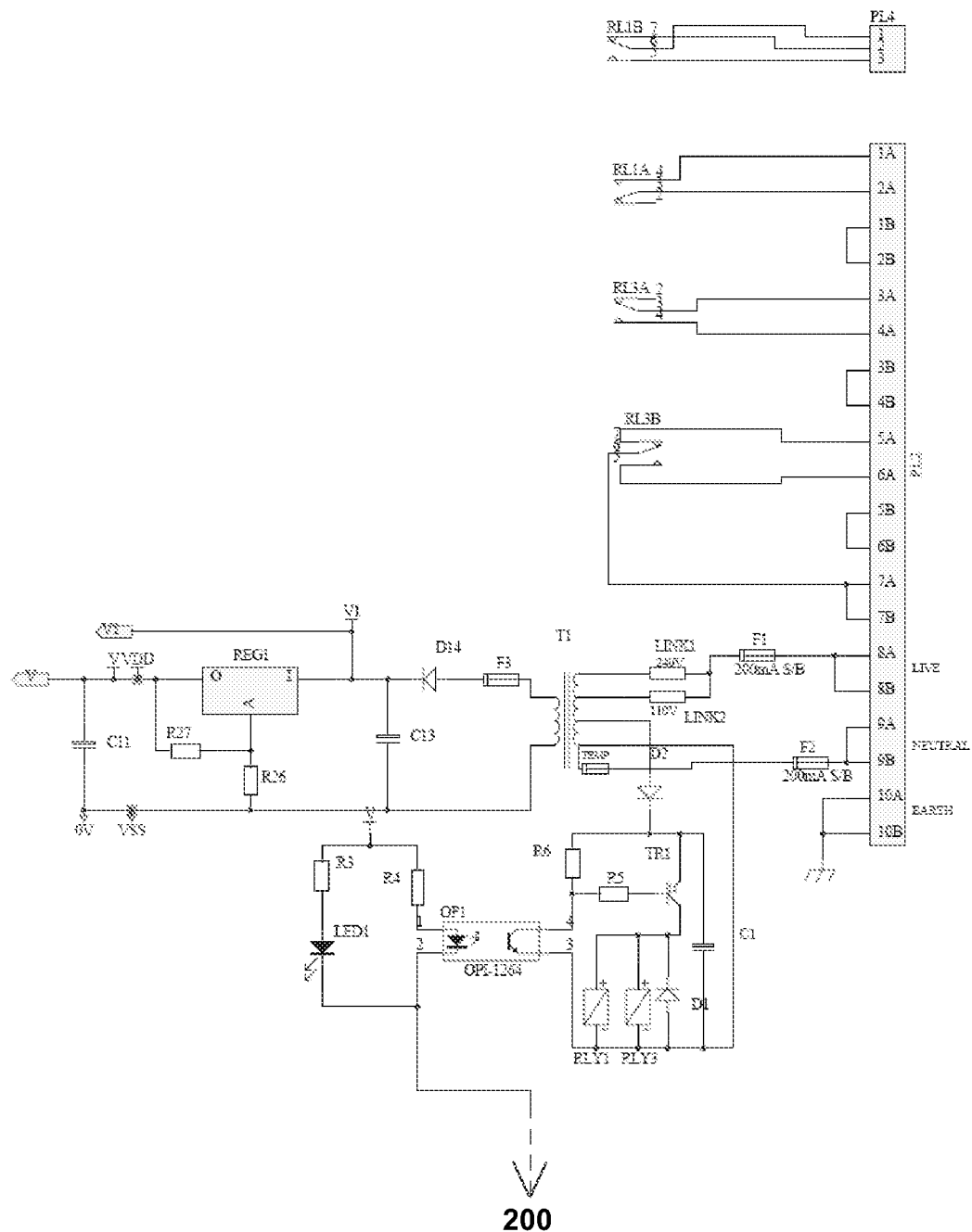
FIG. 8 is a first circuit diagram for the circuit board of FIG. 7.

Referring firstly to FIG. 8, the AC signal that is supplied through pins 8a and 9b of connection socket PL2 passes through fuses F1 and F2, a transformer T1, and a voltage regulator REG1 circuit, so that DC voltages V (approximately 5V) and V1 (approximately 15V) are supplied to the remainder of the circuit.

Figure 9:
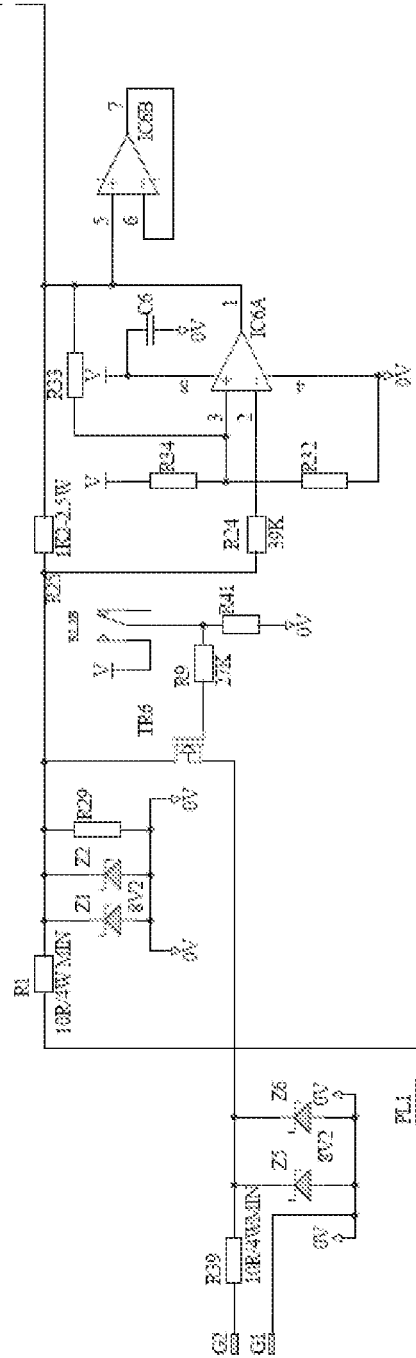
FIG. 9 is a second circuit diagram for the circuit board of FIG. 7.

Turning now to FIG. 9, connections PL1/1 and PL1/2 are connected via the associated dual-core cable 14 to the upper contacts 44a,44b of the earthing clamp 40, and earth connections G1 and G2 are connected via the associated dual-core cable 16 to the electrical terminal 32 at the earthing point of the road tanker. As discussed above, the earthing clamp 40 is engaged with an earth connection 30, such as an earth rod, which is a metal rod that is driven into the earth to form a connection with the earth.

An oscillator circuit including op-amps IC6A and IC6B generates an AC signal that, when connections G1, G2, PL1/1 and PL1/2 are not connected to anything, has a frequency of 182 kHz. In use, this AC signal is fed via resistors R25 and R1, to the earth connection 30, via the associated dual-core cable 14 and the upper contacts 44a,44b of the earthing clamp 40. The AC signal that is supplied to the earth connection 30 will follow a path through the earth and the capacitor that is defined by the road tanker 20 and the adjacent surface of the earth, to the 0V rail of the circuit through connection G1. The electrical path for the AC signal will therefore include the capacitor defined by the road tanker 20 and the adjacent surface of the earth, as well as the resistance between the earth and the upper contacts 44a,44b of the earthing clamp 40. This capacitance and this resistance, and hence the impedance of that part of the circuit, affects the frequency of the oscillator circuit.

There are clearly other resistances and paths for the AC signal, such as a path to earth through the tyres of the road tanker 20, which will have a resistance that is dependent, amongst other things, on the amounts of moisture and salt present on the tyres, the resistance of the road tanker's body, and the resistance of the dual-core cable 14.

The circuit of the device 10 is adapted to verify that the resistance between the earth and the upper contacts of the earthing clamp 40 is less than about 1000Ω, and hence verify the integrity of the earth connection 30. The most variable parts of the electrical path for the AC signal are clearly the capacitance of the road tanker 20, and the resistance between the earth and the upper contacts of the earthing clamp. However, it has been found by experiment that typical road tankers 20 define capacitors with an adjacent surface of the earth that have a capacitance of between 5.0 nF and 3.0 µF. Furthermore, it has been found by experiment that if the road tanker 20 defines a capacitor with an adjacent surface of the earth having a capacitance of between 5.0 nF and 3.0 µF, the frequency of the AC signal will be between 330 Hz and 100 kHz in most weather conditions. In weather conditions that substantially reduce the resistance of the electrical path between the road tanker 20 and the earth, though its tyres, then the frequency of the AC signal may not fall within the pre-determined range, even though the resistance between the earth and the upper contacts of the earthing clamp 40 is less than about 1000Ω. In this case, the user may utilise the remote switch 102 connected to connection socket PL3, which by-passes the testing of the earth connection 30.

Figure 2:
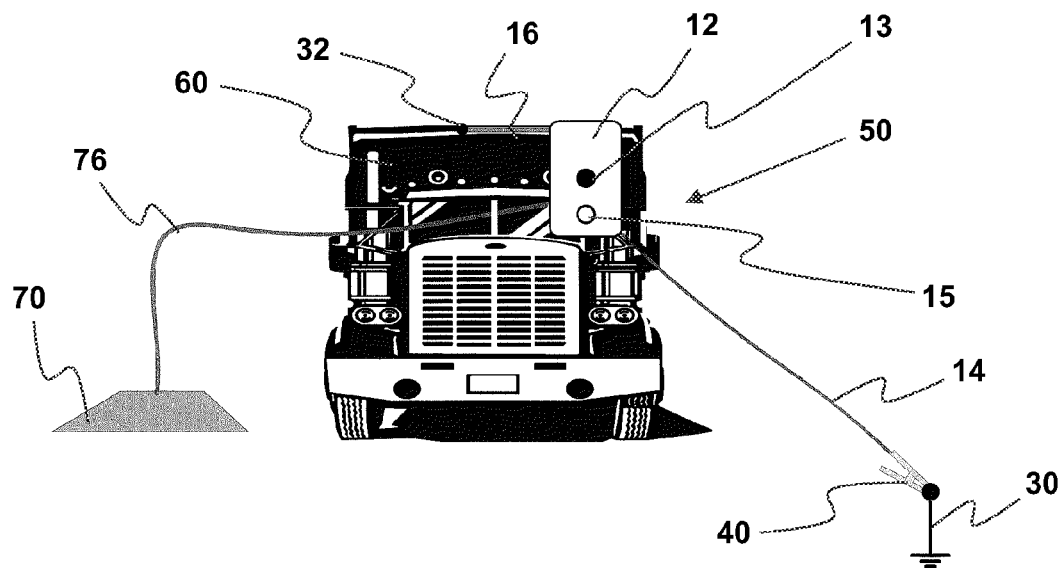
FIG. 2 is a schematic drawing of a second embodiment of a device according to the invention, mounted on a small truck and connected to an earth connection.

If the device according to the invention is used with vehicles having a capacitance that is less than 5.0 nF, then a second embodiment of the device according to the invention should be used, which is shown schematically in FIG. 2. The device is generally designated 50, and is shown mounted on a small truck 60 and connected to the earth connection 30. The device 50 is similar to the first embodiment 10, and comprises a housing 12, a dual-core cable 14 and an associated earthing clamp 40 for connecting the device 50 to the earth connection 30, and a dual-core cable 16 that extends from the device 50 to an electrical terminal 32 at an earthing point of the truck 60. Indeed, the circuit of the second embodiment of the device 50 is identical to the circuit of the first embodiment of the device 10. However, the second embodiment includes a capacitance plate 70 for increasing the capacitance of the capacitor formed by the truck 60 and the adjacent surface of the earth, so that it falls within the pre-determined range of capacitances with which the circuit of the device 50 has been calibrated, ie between 5.0 nF and 3.0 μF.

Figure 5:
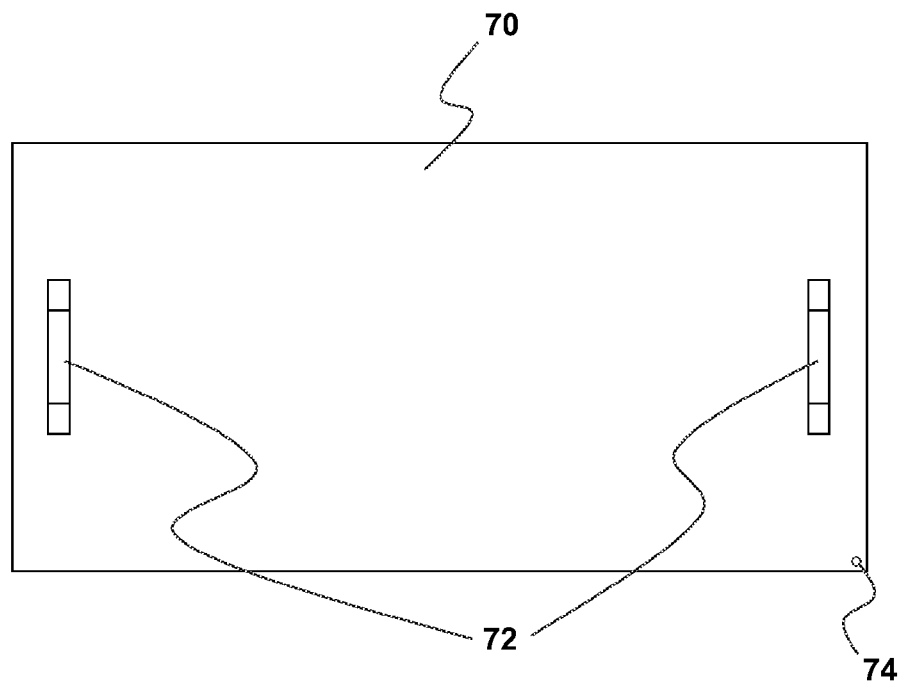
FIG. 5 is a plan view of a capacitance plate that forms part of the second embodiment.
Figure 6:
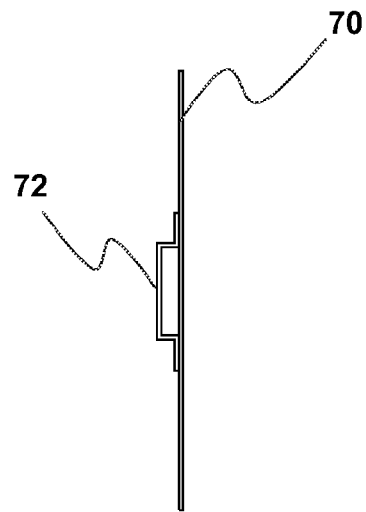
FIG. 6 is an end view of the capacitance plate of FIG. 5.

As shown in FIGS. 5 and 6, the capacitance plate 70 is rectangular in shape, and has a handle 72 at each end of one of its major surfaces. The capacitance plate 70 is adapted to lie flat against the earth, resting upon its other major surface. The capacitance plate 70 is formed of aluminium coated with a water-based, static-dissipative epoxy paint, in order to insulate the capacitance plate 70 from the earth. The capacitance plate 70 also includes a hole 74 with a diameter of 10 mm that enables the capacitance plate 70 to be connected to one end of a dual-core cable 76. The other end of the dual-core cable 76 is connected to the same connections of the circuit with which the earthing point of the truck 60 is connected through the dual core-cable 16 and electrical terminal 32. In all other respects, the first and second embodiments of the device 10,50 operate in the same manner.

Before connection of the device 10,50 to the earth connection 30, the device 10,50 will be in a first non-permissive state, in which the fail indicator lamp 13 is lit and the pass indicator lamp 15 is unlit. In addition, the control circuits 106,107 that allow loading and unloading of flammable material will be de-energised.

Figure 10:
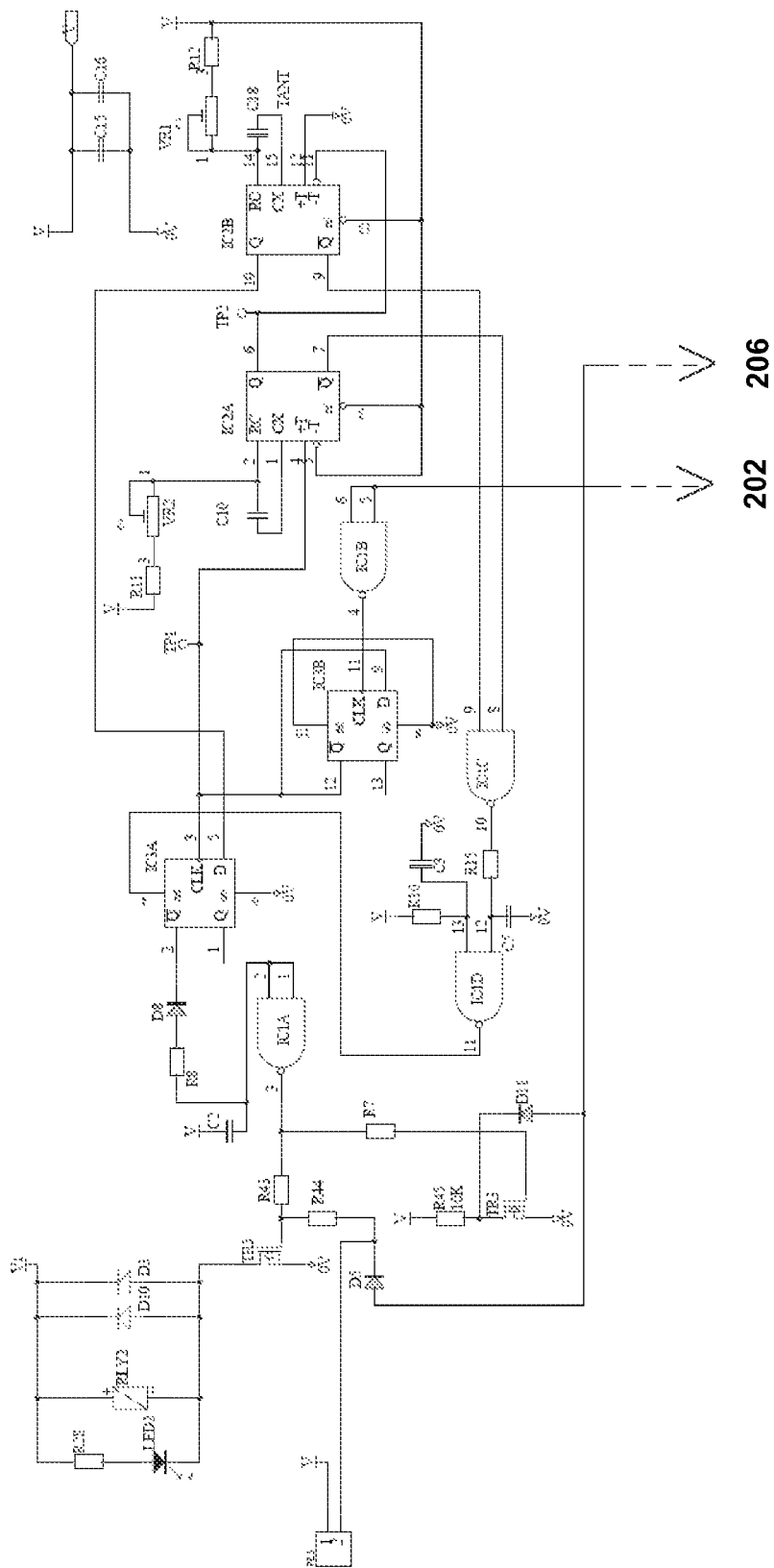
FIG. 10 is a third circuit diagram for the circuit board of FIG. 7.

The AC signal generated by the oscillator circuit is monitored by a band pass filter circuit formed by IC1, IC2 and IC3, as shown in FIG. 10. When the frequency is between 330 Hz and 100 kHz, the band pass filter circuit energises transistor TR5, so that relay RLY2 is activated. The band pass filter circuit therefore verifies that the resistance between the upper contacts of the earthing clamp 40 and the earth, via the earth connection 30, is between 0 and about 1000Ω, and then activates relay RLY2. As discussed above, the remote switch 102 connected to connection socket PL3 enables the user to by-pass this testing of the earth connection 30. In particular, activation of this switch manually energises transistor TR5, so that relay RLY2 is activated.

Turning now to FIG. 9, activation of relay RLY2 causes relay contact RL2B to be switched, which in turn energises transistor TR6, and hence connects connection PL1/2 and connection G2 together, via resistor R39, transistor TR6, resistor R1. This connects the electrical terminal 32 at the earthing point of the vehicle 20,60 with the verified earth provided by the earth connection 30, and hence earths the vehicle 20,60 through its earthing point.

Figure 11:
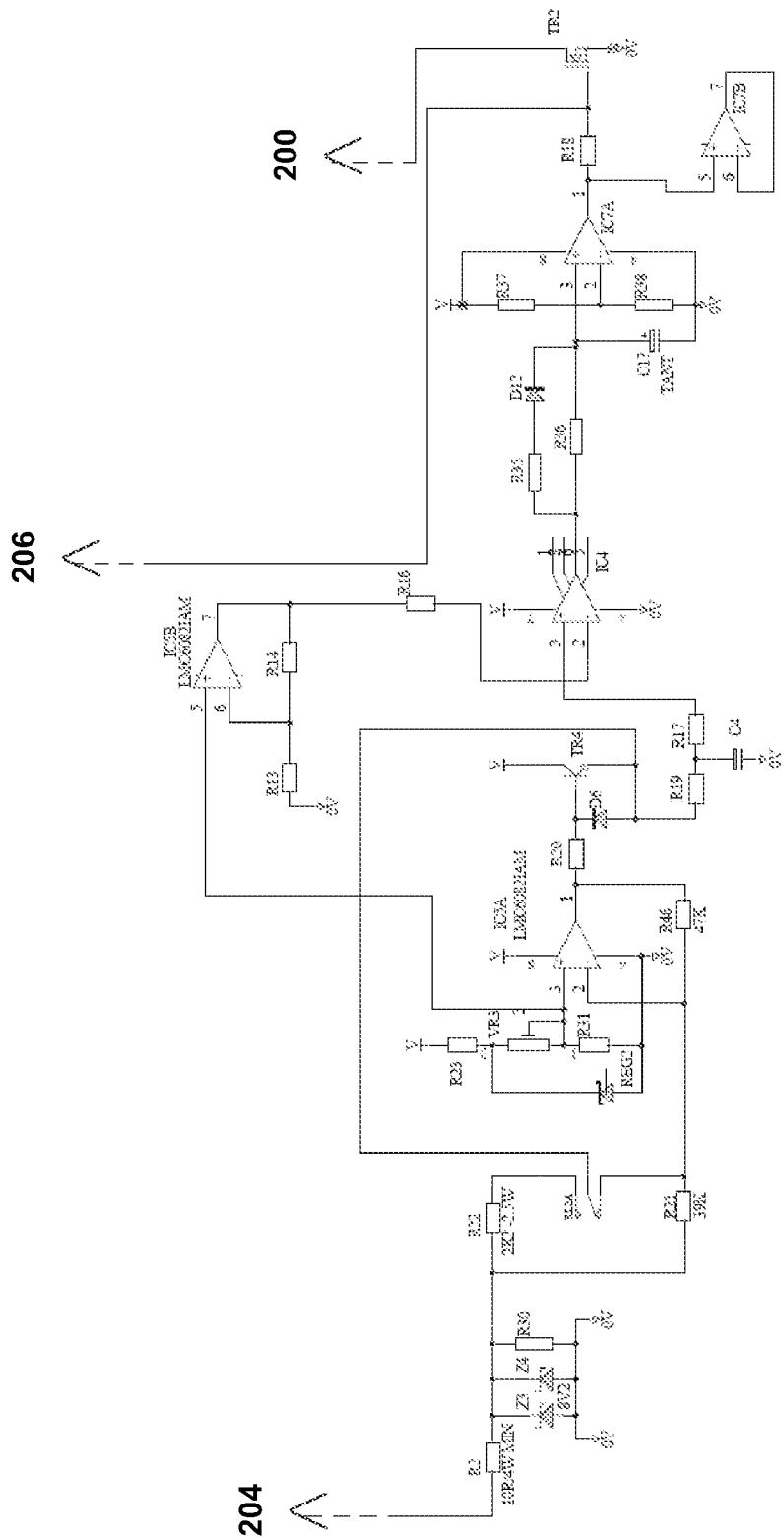
FIG. 11 is a fourth circuit diagram for the circuit board of FIG. 7.

A comparator circuit including IC5A, which is shown in FIG. 11, will then energise transistor TR4 provided that the resistance between the upper contacts of the earthing clamp 40, and the resistance between the two contacts of the dual-core cable 16 within the electrical terminal 32, together equal a resistance that is less than about 10Ω. However, if this resistance is greater than about 10Ω and the capacitance condition is still met, the device 10,50 will remain in a second non-permissive state, in which the circuit controlling RLY1 causes it to pulse on and off, and the fail indicator lamp 13 to be lit. Furthermore, the control circuits 106,107 that allow loading and unloading of flammable material will remain de-energised.

Since it is much less likely that a bad connection will be present at the electrical terminal 32, and hence the resistance at the electrical terminal 32 will generally be negligible, transistor TR4 will in most cases be energised provided that the earthing clamp 40 is effectively connected to the earth connection 30 by a resistance of about 10Ω or less. In particular, voltage regulator REG2 provides a low voltage reference signal to pin 3 of IC5A via potentiometer VR3. If the resistance between the upper contacts of the earthing clamp 40 is less than about 10Ω, the voltage at pin 2 of IC5A will be less than the voltage of the reference signal, which will cause IC5A to energise transistor TR4.

The voltage changes created by the energisation of transistor TR4 are detected by the comparator circuit formed by IC5B and IC4, which causes the output of IC4 to change state, which in turn changes the state of a fast start, slow drop out circuit formed by IC7A and IC7B. This energises transistor TR2, which allows current to flow into the diode of opto-isolator OP1, and causes transistor TR1 to be energised. This activates relays RLY1 and RLY3, and corresponding contacts RL1A, RL3A and RL3B connected to connector PL2, and corresponding contact RL1B connected to connector PL4. Contact RL3B switches power from the fail indicator lamp 13 to the pass indicator lamp 15, contacts RL1A and RL3A energise the control circuits 106,107 that allow loading and unloading of flammable material, such as vehicle pumping systems, and contact RL1B sends a data signal to the computer 108. The device 10,50 has now been switched into a permissive state.

When the device 10,50 is in its permissive state, and hence TR4 is energised, an intrinsically safe DC current flows through it to one of the upper contacts 44a of the earthing clamp 40, via resistors R22 and R2, connector PL1/1, and dual-core cable 14. The DC current then flows from the other upper contact 44b of the earthing clamp 40 to one of the contacts of the dual-core cable 16 at the electrical terminal 32, via dual-core cable 14, connector PL1/2, resistor R1, transistor TR6, resistor R39, connector G2 and dual-core cable 16. Finally the DC current flows from the other contact of the dual-core cable 16 at the electrical terminal 32 to the 0V rail of the circuit, via dual-core cable 16 and connector C1. An intrinsically safe DC current loop therefore passes through the earthing clamp 40, the electrical terminal 32, and the associated dual-core cables 14,16. In this state, the capacitance of the vehicle 20,60 relative to the adjacent surface of the earth has no further effect on the state of the circuit. However, if the resistance between the upper contacts of the earthing clamp 40, and the resistance between the two contacts of the dual-core cable 16 within the electrical terminal 32, together equal a resistance that is greater than about 10Ω at any point in time, this will cause a corresponding voltage rise at pin 2 of IC5A. When the voltage at pin 2 exceeds the voltage of the reference signal at pin 3, IC5A will switch off and hence de-energise transistor TR4 and de-activate relay RLY2. If the capacitance condition is still met, the device 10,50 will switch into its second non-permissive state, in which the circuit controlling RLY1 causes it to pulse on and off, and the fail indicator lamp 13 to be lit. Furthermore, the control circuits 106,107 that allow loading and unloading of flammable material will become de-energised.

A third embodiment of the invention will now be described with reference to FIGS. 12-15. In particular, FIGS. 12-15 show those parts of the circuit of the third embodiment that are different from the corresponding parts of the circuit of the first and second embodiments. Indeed, FIGS. 12-15 effectively replace FIGS. 8 and 9 for the third embodiment, such that FIGS. 10-15 are circuit diagrams that together show the circuit of the third embodiment. The circuit has been divided between five Figures for clarity. The divided parts of the circuit are connected along connecting paths 200, 202, 204, 206, 300 and 302, which are indicated by appropriately labelled arrows in FIGS. 10 to 15.

The third embodiment functions in a very similar manner to the first and second embodiments. However, there are some differences that will be described in more detail below.

Figure 12:
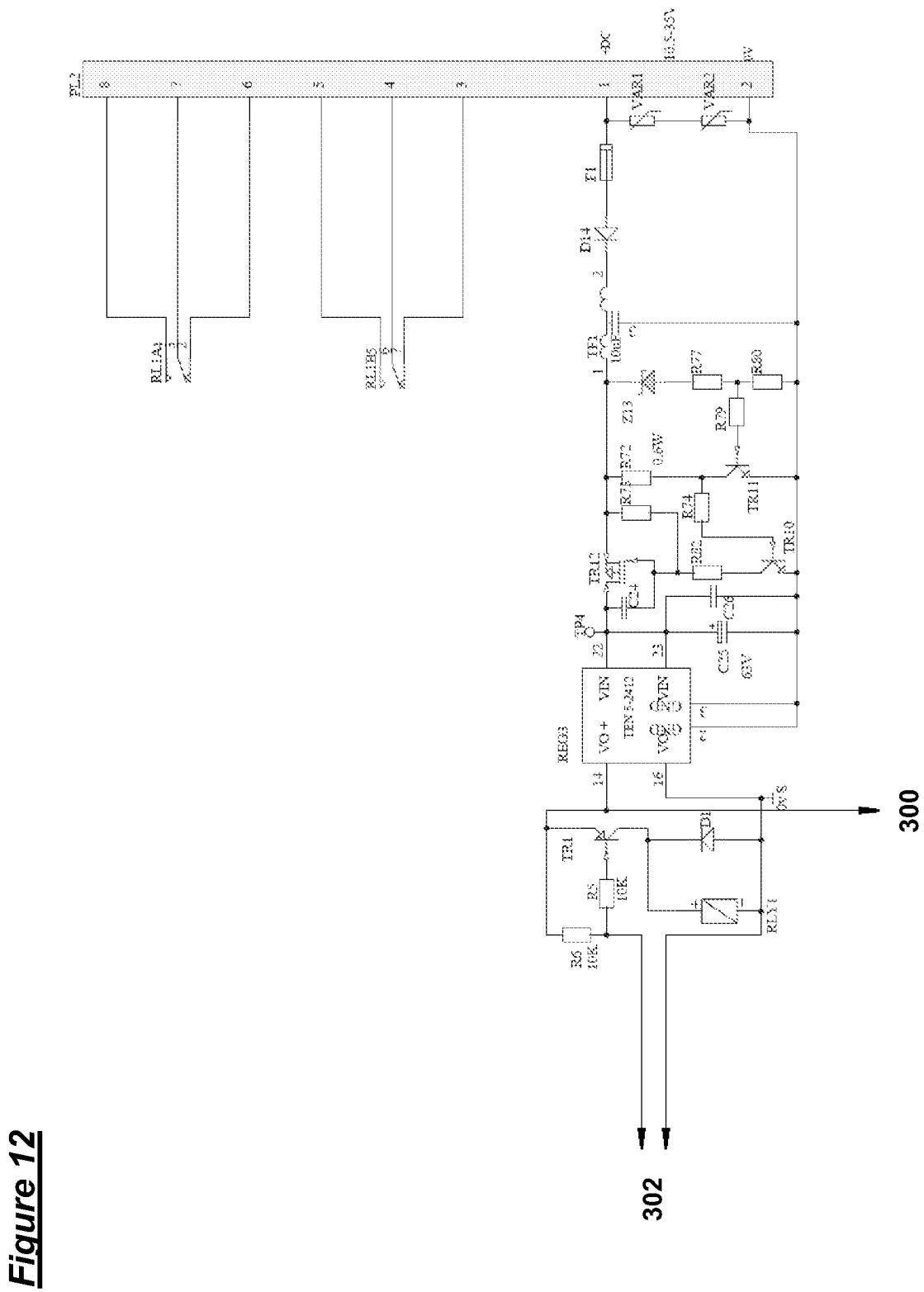
FIG. 12 is a first circuit diagram for a third embodiment of a device according to the invention.
Figure 13:
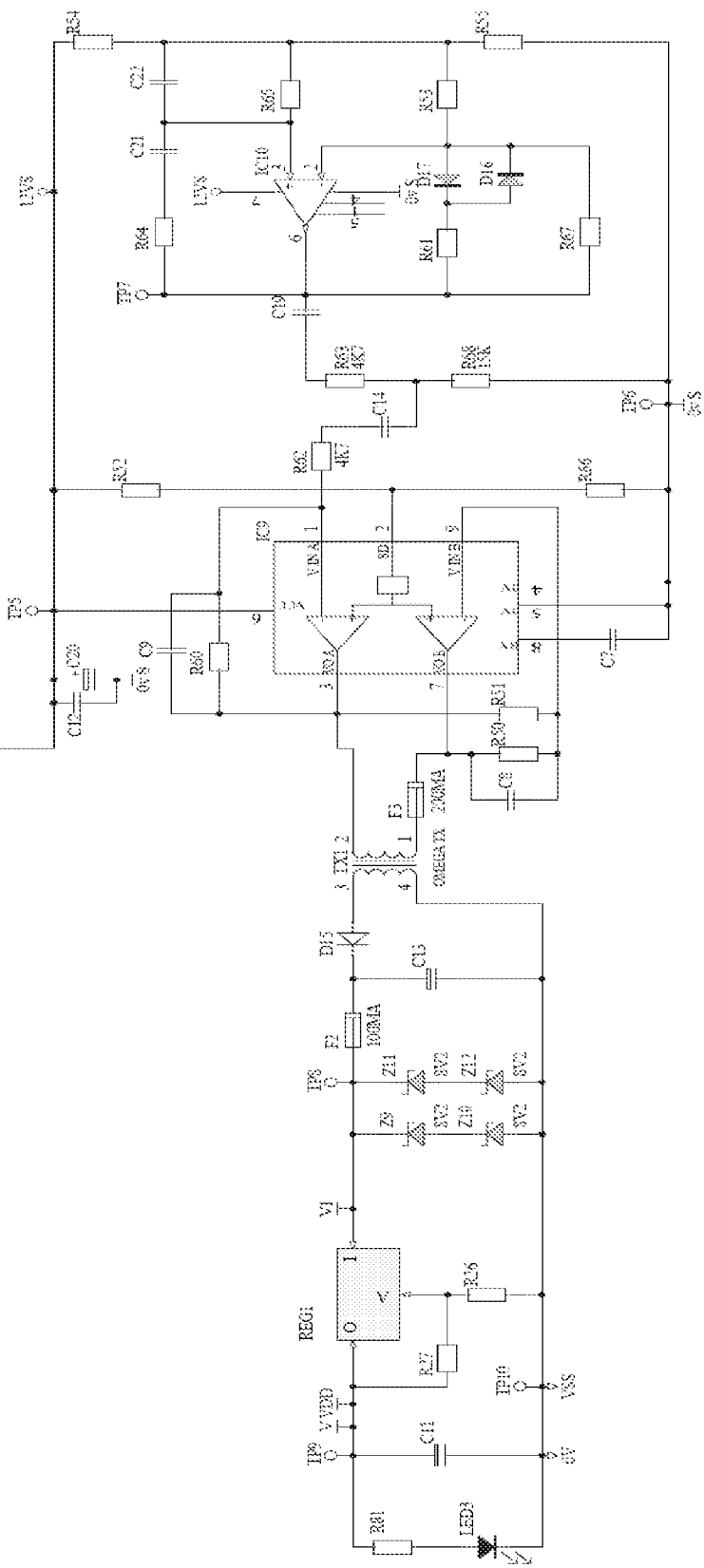
FIG. 13 is a second circuit diagram for the third embodiment.

Firstly, the third embodiment comprises a power supply unit (PSU) adapted to connect to both 12V and 24V DC power supplies, and in particular a standard vehicle battery. The PSU of the third embodiment is illustrated in FIGS. 12 and 13. The PSU comprises a switched-mode power supply including a DC-DC converter, voltage regulator (REG1) and a surge protection circuit. In particular, the PSU includes a connector, PL2, that is adapted to connect to the 12V or 24V vehicle battery (not shown in the Figures), and the PSU is adapted to output DC voltages V (approximately 5V) and V1 (approximately 15V) for powering the remainder of the circuit.

A further difference from the first and second embodiments is that this PSU is housed separately from the remainder of the circuit. In particular, the PSU has its own housing, and is located in the proximity of the battery of the vehicle upon which the device is mounted, typically at the front of the vehicle. The remainder of the circuit is housed within a monitoring unit located at a different part of the vehicle, typically at the rear of the vehicle. The PSU and the monitoring unit are connected by a cable that connects the V, V1 and 0V outputs of the PSU to the monitoring unit, and also connects the PSU to the opto-isolator OP1 within the monitoring unit (ie connects arrow 302 in FIG. 12 with arrow 302 in FIG. 14.

Since the earth connection 30 to which the vehicle is to be connected will typically be at the rear of the vehicle, this arrangement of a separate PSU and monitoring unit removes the need for the cable 14 to the earthing clamp 40 to be of sufficient length to run along the entire length of the vehicle, from the front to the rear, in order to connect to the earth connection. This arrangement therefore removes the need for the length of the cable to be adapted specifically for each vehicle, and also removes any requirement for calibrating the circuit of each device to take account of the capacitance effects of the particular length of cable 14 that is being utilised. In particular, devices may be supplied with a standard, relatively short, length of cable 14, the capacitance effects of which have already been taken into account in the calibration of the device.

Figure 14:
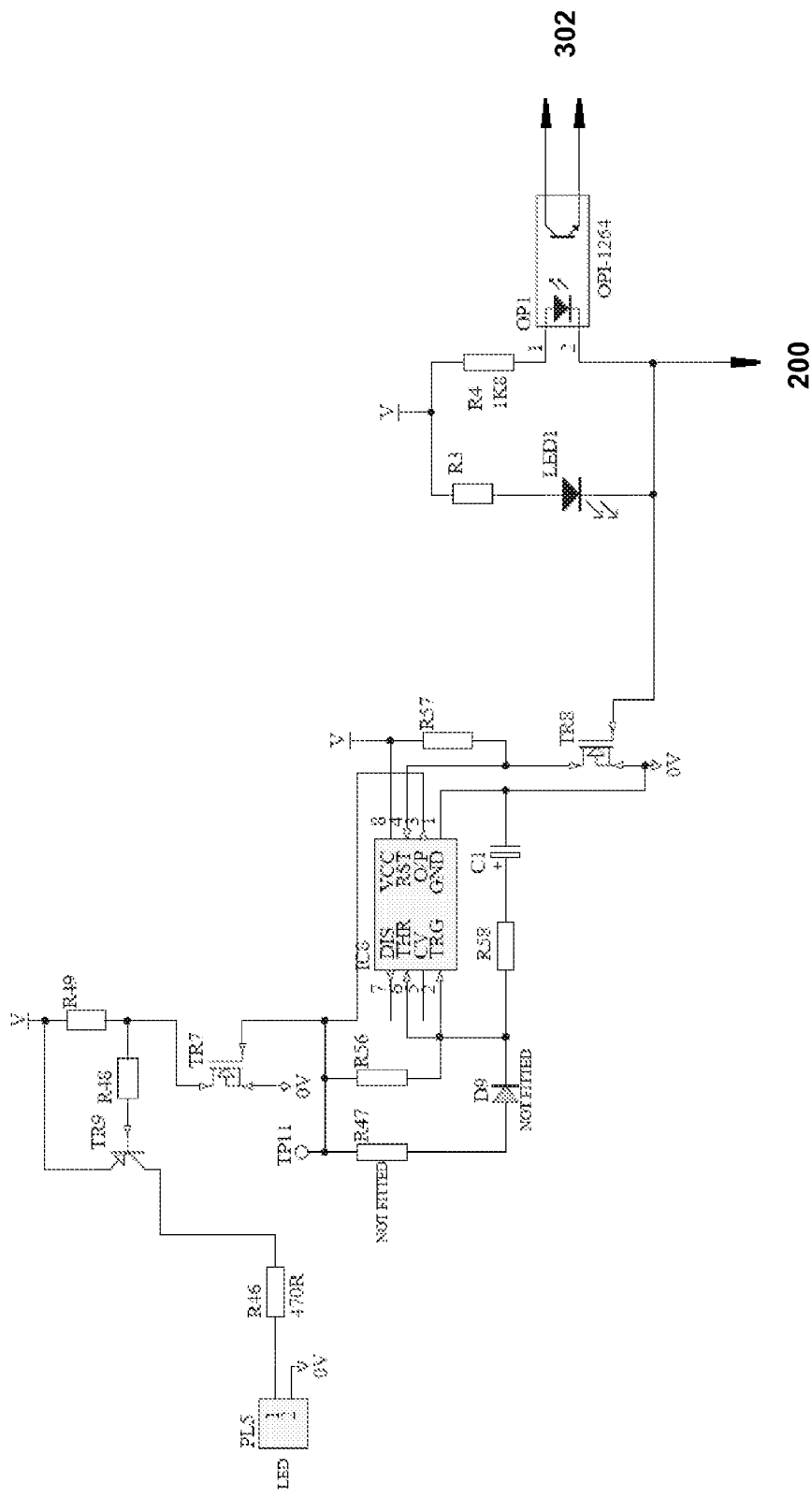
FIG. 14 is a third circuit diagram for the third embodiment.

The PSU also includes relay RLY1, and corresponding contacts RL1A and RL1B connected to connector PL2, for energising the control circuits 106,107 that allow loading and unloading of flammable material, such as vehicle pumping systems. However, in contrast to the first and second embodiments, the PSU of the third embodiment does not include relay RLY3 for switching power between the fail indicator lamp 13 and the pass indicator lamp 15. Instead, the third embodiment includes a circuit within the monitoring unit, which is shown in FIG. 14, that causes appropriate signals to be sent to an array of three LEDs connected to PL5, in order to indicate to the user the state of the circuit, ie whether it is in its non-permissive state (eg red LED), or its permissive state (eg three flashing green LEDs). The LEDs are mounted on the monitoring unit so as to be readily visible to the user. In this embodiment of the invention, the part of the circuit that is shown in FIG. 14 drives three flashing LEDs that indicate the permissive state, whereas the non-permissive state is indicated by no LEDs being illuminated.

Figure 15:
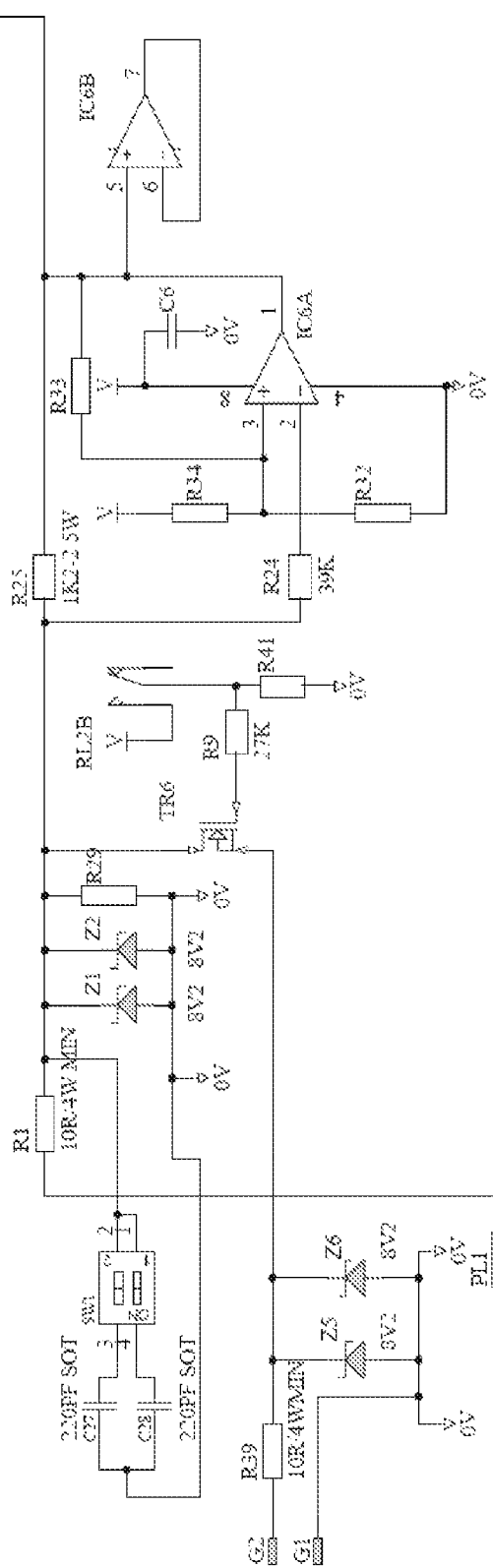
FIG. 15 is a fourth circuit diagram for the third embodiment.

As shown in FIG. 15, the third embodiment also includes a pair of capacitors C27 and C28, and an associated switching unit SW1 adapted to connect any one of the capacitors C27, C28, or both of the capacitors C27,C28, to the remainder of the circuit. When these capacitors are connected to the circuit, the effective capacitance affecting the frequency of the oscillator circuit will be increased. These capacitors are therefore suitable for being connected to the circuit in the event that the vehicle's capacitance relative to the adjacent surface of the earth is low. Furthermore, these additional capacitors are less affected by series resistance within the earth, and therefore make the circuit more reliable where high electrical resistance soil conditions exist.

The invention claimed is:

1. A device for testing an earth connection that is isolated from a mains electricity supply, the device comprising means for electrically connecting the device to the earth connection, means for electrically connecting the device to an electrically conductive item having a capacitance relative to an adjacent surface of the earth that is within a pre-determined range of capacitances, means for generating an AC signal and delivering the AC signal to the electrically conductive item, frequency determination means for determining whether a frequency of the generated AC signal falls within a predetermined range of frequencies, and means for determining whether a resistance between the earth connection and an earth reference potential is less than a maximum earth resistance value from an output of said frequency determination means.

2. A device as claimed in claim 1, wherein the device includes means for connecting the electrically conductive item to the earth connection if the frequency of the generated AC signal falls within the pre-determined range of frequencies, and hence the resistance between the earth connection and earth reference potential is less than the maximum earth resistance value.

3. A device as claimed in claim 1, wherein the pre-determined range of frequencies corresponds to impedances generated by at least the pre-determined range of capacitances, and resistances between the earth connection and earth reference potential that are less than the maximum earth resistance value.

4. A device as claimed in claim 1, wherein the device is adapted to be mounted on the electrically conductive item.

5. A device as claimed in claim 4, wherein the device is adapted to be mounted on a vehicle.

6. A device as claimed in claim 5, wherein the device comprises a power supply unit for connecting the device to a battery of the vehicle, and a monitoring unit including a measurement circuit and connections to the vehicle and the earth connection.

7. A device as claimed in claim 6, wherein the power supply unit and the monitoring unit are housed separately.

8. A device as claimed in claim 1, wherein the device is adapted to be mounted on the earth connection itself, or on a mounting adjacent to the earth connection.

9. A device as claimed in claim 8, wherein the device is adapted to be mounted on, or adjacent to, metalwork that is in contact with the earth, where the metalwork forms the earth connection.

10. A device as claimed in claim 1, wherein the device is provided with means for increasing the capacitance encountered by the AC signal, so that a particular device may be used with electrically conductive items that define a capacitor having a lower capacitance than that achieved by items with which the device has been calibrated.

11. A device as claimed in claim 10, wherein the means for increasing the capacitance encountered by the AC signal comprises one or more capacitors adapted to be selectively connected to the circuit.

12. A device as claimed in claim 10, wherein the means for increasing the capacitance encountered by the AC signal comprises an additional electrically conductive item that is separated from the earth by an insulating material, the additional electrically conductive item being connected to the circuit.

13. A device as claimed in claim 12, wherein the additional electrically conductive item comprises a metal plate and an electrically insulating barrier, such that the additional electrically conductive item is adapted to rest upon the surface of the earth, but be insulated therefrom.

14. A device as claimed in claim 1, wherein the device includes means for automatically connecting the electrically conductive item to the earth connection when the device has established that the frequency of the generated AC signal falls within the pre-determined range of frequencies, and hence the resistance between the earth connection and earth reference potential is less than the maximum earth resistance value.

15. A device as claimed in claim 14, wherein the means for comparing the frequency of the generated AC signal with a pre-determined range of frequencies may be adapted to actuate an electronic switch that causes the device to define an electrical path between the earth connection and the connection with the electrically conductive item.

16. A device as claimed in claim 15, wherein the device is adapted to switch into a permissive state, if the frequency of the generated AC signal falls within the pre-determined range of frequencies, in which an indicator indicates to the user that the electrically conductive item is effectively connected to earth reference potential through the earth connection and/or a control circuit is actuated that enables a particular action to take place.

17. A device as claimed in claim 1, wherein the device includes means for determining whether the resistance between the electrically conductive item and the earth connection is within an acceptable range.

18. A device as claimed in claim 17, wherein the means for electrically connecting the device to the earth connection and the means for electrically connecting the device to the electrically conductive item are electrical connectors that include at least two separate electrical contacts.

19. A device as claimed in claim 18, wherein the device is adapted for use with different electrically conductive items and/or different earth connections, and at least one of the electrical connectors is removably connectable to the earth connection or the electrically conductive item.

20. A device as claimed in claim 19, wherein the device includes means for determining whether the resistance between the two electrical contacts of an electrical connector that is removably connectable to either the earth connection or the electrically conductive item is less than a predetermined contact resistance value.

21. A device as claimed in claim 20, wherein the means for determining whether the resistance between the electrically conductive item and the earth connection is within an acceptable range comprises a DC current loop that includes a path between the two electrical contacts of the electrical connector, and has a voltage output that is dependent upon the resistance between the contacts of electrical connectors, and a comparator which determines whether said voltage output is greater or less than a pre-determined reference voltage, and hence whether the resistance between the contacts of the electrical connector is less than the predetermined contact resistance value.

22. A device as claimed in claim 17, wherein the device is adapted to switch into a permissive state, if the frequency of the generated AC signal falls within the pre-determined range of frequencies and the resistance between the electrically conductive item and the earth connection is within an acceptable range, in which an indicator indicates to the user that the electrically conductive item is effectively connected to earth reference potential through the earth connection and/or a control circuit is actuated that enables a particular action to take place.

23. A device as claimed in claim 22, wherein a resistance monitoring mode is triggered when the device is switched to a permissive state, in which the device monitors, either continually or intermittently, whether the resistance between the two electrical contacts of a removably connectable electrical connector is less than a predetermined value.

24. A device as claimed in claim 23, wherein the device includes a DC current loop that includes a path between the electrical contacts of the removably connectable electrical connector and has a voltage output that is dependent upon the resistance between the electrical contacts, and a comparator which determines whether said voltage output is greater or less than a pre-determined reference voltage, and hence whether the resistance between the electrical contacts is less than the predetermined contact resistance value, and if this condition is not satisfied at any point in time, the device switches to a non-permissive state.

25. A device as claimed in claim 1, wherein the device includes outputs for indicating to the user the status of the earth connection, and/or outputs for controlling external operations.

26. A method of testing an earth connection that is isolated from a mains electricity supply, the method comprising the steps of:
   (a) electrically connecting a device to the earth connection, and electrically connecting the device to an electrically conductive item having a capacitance relative to an adjacent surface of the earth that is within a pre-determined range of capacitances,
   (b) generating an AC signal and delivering the AC signal to the electrically conductive item,
   (c) determining whether a frequency of the generated AC signal falls within a predetermined range of frequencies, and
   (d) determining whether the resistance between the earth connection and earth reference potential is less than a maximum earth resistance value based on the determination whether the frequency of the generated signal falls within the predetermined range of frequencies.

27. A method as claimed in claim 26, wherein the connecting further comprises
   connecting the electrically conductive item to the earth connection if the frequency of the generated AC signal falls within the pre-determined range of frequencies.

* * * * *